United States Patent [19]

DeGree et al.

[11] Patent Number: 4,810,563
[45] Date of Patent: Mar. 7, 1989

[54] THERMALLY CONDUCTIVE, ELECTRICALLY INSULATIVE LAMINATE

[75] Inventors: David C. DeGree, Burnsville; Herbert J. Fick; Bruce H. Juenger, both of Northfield, all of Minn.

[73] Assignee: The Bergquist Company, Minneapolis, Minn.

[21] Appl. No.: 114,855

[22] Filed: Oct. 30, 1987

Related U.S. Application Data

[63] Continuation-in-part of Ser. No. 839,524, Mar. 14, 1986, abandoned.

[51] Int. Cl.$^4$ .................. B32B 15/08; H05K 3/46
[52] U.S. Cl. ........................... 428/209; 165/185; 174/68.5; 428/328; 428/329; 428/339; 428/458; 428/901
[58] Field of Search ............... 165/185; 174/16 HS, 174/138 G, 68.5; 361/386, 387, 388, 389, 403; 428/328, 329, 339, 209, 458, 901

[56] References Cited

U.S. PATENT DOCUMENTS 4,492,730 1/1985 Oishi et al. .................. 428/328
4,574,879 3/1986 DeGree et al. ............... 428/447 X
4,670,325 6/1987 Bakos et al. .................. 174/68.5 X

*Primary Examiner*—Michael Lusignan
*Attorney, Agent, or Firm*—Orrin M. Haugen; Thomas J. Nikolai; Frederick W. Niebuhr

[57] ABSTRACT

A thermally conductive laminate structure for use as a mounting base and/or chassis attachment member in combination with solid-state electronic devices, the laminate preferably comprising up to five layers including a pair of outer metallic layers disposed on opposite sides of center composite layers of electrically insulative layers separated by an interposed metallic layer. The center insulative layers are films of polyimide(amide) material, with the polyimide(amide) film being filled with a quantity of aluminum oxide, boron nitride, or other suitable particulate solid in an amount ranging from between about 30% and 100% by weight of polyimide(amide) solids. The outer layers are metallic, with the base member being a metallic pad of copper or aluminum, and with the opposed metallic layer being copper and arranged in a printed circuitry pattern or array.

34 Claims, 1 Drawing Sheet

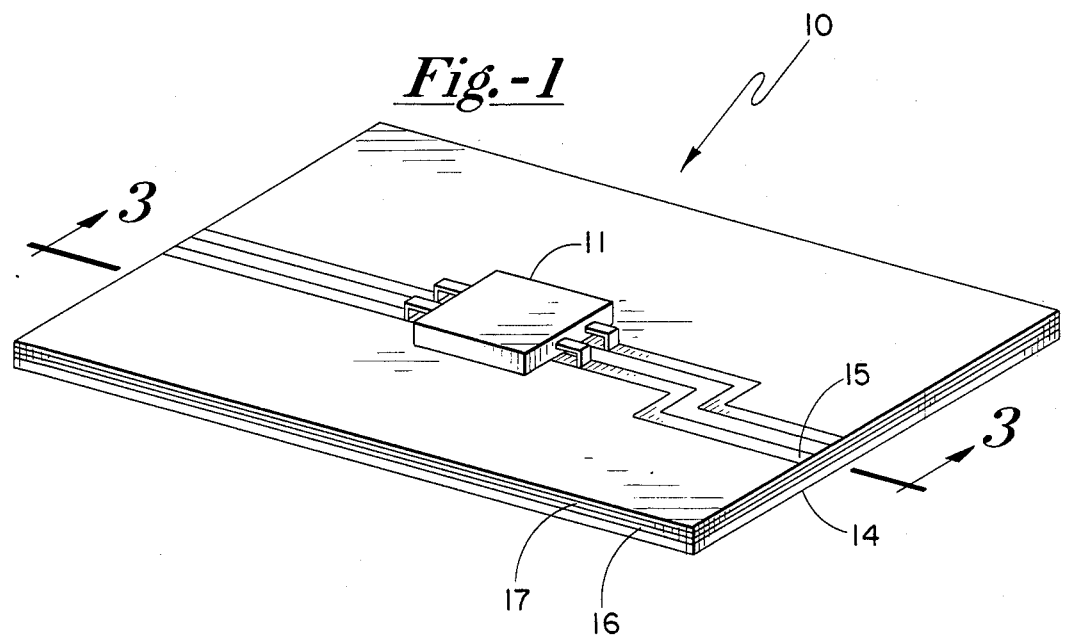
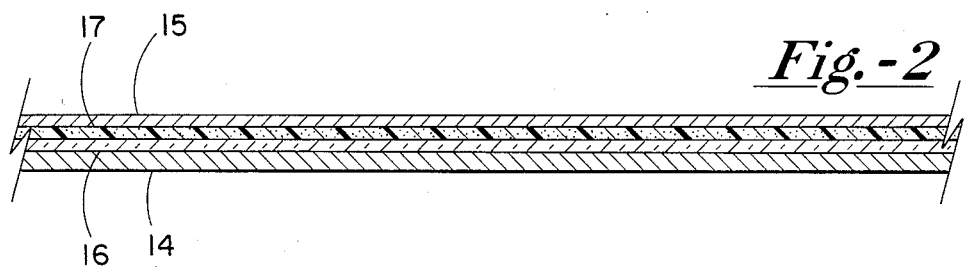
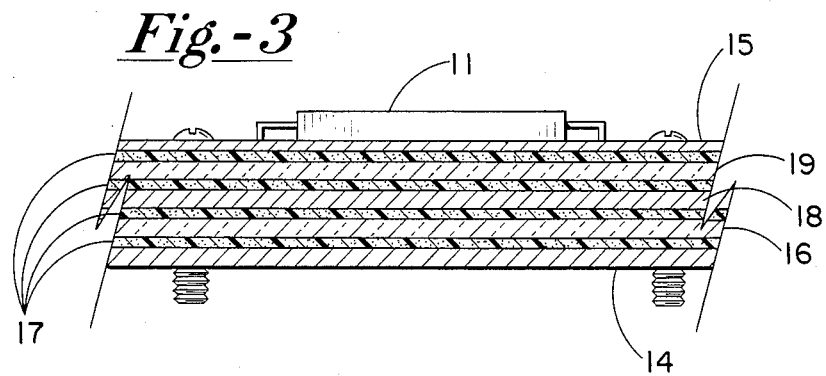

THERMALLY CONDUCTIVE, ELECTRICALLY INSULATIVE LAMINATE

CROSS-REFERENCE TO RELATED APPLICATION

This is a Continuation-in-Part application of Ser. No. 839,524 filed Mar. 14, 1986, now abandoned.

BACKGROUND OF THE INVENTION

The present invention relates generally to an improved assembly comprising a combination of a thermally conductive electrically insulative multi-layered laminate with one of the outer layers of the laminate having a printed circuit or a surface mounting arrangement for receiving and mountably positioning a semiconductor device thereon. The assemblies fabricated in accordance with the present invention are particularly adapted for use as highly responsive thermally conductive mounting pads forming an electrical isolation barrier with the chassis when one or more solid-state electronic devices are operatively mounted on the pad and electrically coupled to the circuitry. The arrangement utilizes a plurality of electrically insulative and thermally conductive layers interposed between two or more highly thermally conductive layers. One of the highly thermally conductive layers serves as the ultimate strata or rigid base layer upon which the other layers are mounted, and as such is properly termed the base or substrate for the assembly. The outer layer forming the opposed surface normally serves as a circuitry array and/or surface mounting pad or arrangement for one or more solid-state devices. In order to improve the electrical properties for the assembly, it is normally preferred that a plurality of relatively thin electrically insulative layers be employed. The thermally conductive properties for the assembly may be improved by interposing a highly thermally conductive layer of reasonable thickness between electrical isolation layers, thereby providing a means for rapidly spreading thermally energy being transferred across and through the individual electrical isolation barriers. Thin layers of epoxy resin adhesive, preferably in multiple layer form, are typically employed to bond together the individual layers of the assemblies of the present invention.

The entire assembly is normally mounted upon the chassis which forms the ultimate support and heat sink, normally providing a support for one or more thermally conductive substrate assemblies, and with each such assembly having one or more semiconductor devices disposed thereon. The thermal and electrical properties required are that each of the layers comprising the laminated structure be thermally conductive and with at least one intermediate layer of the laminate being electrically insulative and with certain others being electrically conductive. The individual layers are securely bonded together as an assembly, with air entrapment and/or voids being, of course, carefully avoided. Multiple layers of electrically insulative particulate solid laden film are preferably employed, and it is frequently desirable to interpose a thermally conductive metallic layer between such insulative layers for heat spreading purposes. The interposed metallic layer effectively increases and/or otherwise expands the effective area for thermal conductivity through the laminated structure, with this interposed metallic layer thereby functioning primarily as a thermal energy distributing or heat spreader layer for the overall assembly. The rate of heat dissipation for the semiconductor device mounted thereon is accordingly increased.

One outer layer of the thermally conductive electrically insulative laminate, as indicated above, serves as a surface mounting arrangement for one or more solid-state devices and may be in the form of a printed circuitry layer appropriately coupled to the solid-state device. This layer is preferably fabricated from a material such as copper, or aluminum-clad copper. In certain applications, solder films or layers may be provided on the surface of the copper. Such assemblies do, of course, contribute to ease of permanent mounting of solid-state devices thereon.

The combination of properties provided in the present arrangement is not available in nature. Accordingly, the present invention which provides these unusual results comprises a multi-layer laminate incorporating a metallic base or substrate, with one or more distinct electrically insulative and thermally conductive layers being disposed thereon, and with one or more conductive metallic layers frequently being interposed between the insulative layers, including one printed circuitry layer or surface mounting layer being arranged on the outer surface. A solid-state electronic device is normally mounted on the surface of the printed circuitry, and additionally, other devices such as surface mount resistors and/or leadless chip carriers including one or more chip assemblies may be received on the surface of the outer (upper) circuitry layer. The subject matter of the present invention is related and constitutes an improvement to that disclosed in co-pending applications Ser. No. 584,897, filed Feb. 29, 1984, entitled "MOUNTING PAD FOR SOLID-STATE DEVICES", now U.S. Pat. No. 4,574,879, and Ser. No. 752,669, filed July 8, 1985, entitled "LAMINATED MOUNTING PAD FOR SOLID-STATE DEVICES", both applications being assigned to the same assignee as the present invention.

Materials, including elements, compounds, and compositions of matter rarely possess the combined properties of being both highly thermally conductive and highly electrically insulative. Since the materials possessing such a combination of properties are rare, one must ordinarily seek compromises in one or more of the physical and electrical properties in order to find a useful material or combination of materials. The efficacy of the final products accordingly become limited.

One technique for decreasing the thermal impedance in an electrically insulative material is to utilize such a material in a form having a thin cross-sectional thickness. The thickness is, however, consistent with the required mechanical and electrical properties. However, as the cross-sectional thickness decreases, the risk of rupture, cracking, or fracture of the insulative material increases, thereby increasing the risk for reduction or derogation of electrical properties. Such derogation may lead to an increased risk of electrical failures for devices functionally mounted thereon. In order to further decrease the thermal impedance in an electrically insulative film, it is now possible to load such films with a quantity of particulate solid material having reasonable thermal conductivity. In the devices of the present invention, polyimide(amide) or epoxy films loaded with particulate solids are employed.

In the present arrangement, it has been found desirable to utilize multiple thin layers or films of electrically insulative materials in order to enhance the electrical properties of the overall assembly without unusual sacrifice of the physical properties of the assembly. Typically, electrically insulative films or layers are filled with a thermally conductive material in the form of a particulate solid. In one aspect of the present invention, multiple thin layers of electrically insulative material may be employed, with highly thermally conductive metallic layers of reasonable cross-sectional thickness being interposed therebetween. In such a structure, therefore, the thermal properties of individual multiple thin layers normally function on a synergistic level or basis rather than merely on an additive or accumulative basis. The intervening metallic layers function to increase the effective area of thermal conductivity through the assembly, while at the same time increasing the mechanical stability and durability of the entire assembly. The insulative layers are normally somewhat flexible or pliable, and as such may function as energy absorption layers when the assembly is subject to heat stresses such as those experienced during normal production operations. Thus, when subjected to those heat or temperature excursions normally experienced in component or die mounting processes, delamination or other problems which occasionally arise at the interfaces between layers are virtually eliminated.

Further desirable properties or characteristics in the layers or combinations of layers comprising the finished product include chemical resistance, mechanical toughness, as well as mechanical durability. In order to obtain this combination of properties, the insulating member or members and the circuitry pattern must be resistant to chemicals encountered in printed circuit processes, as well as resistant to failures which may be caused by such mechanical operations as cutting, molding, broaching, coining or folding, which may result in cutting, ripping, cracking, or puncturing of certain of the layers. The mechanical and electrical properties as set forth hereinabove are desirable in order to provide an electrical mounting member which is sufficiently tough and durable so as to withstand the thermal energy and peak temperatures reasonably expected to be reached during subsequent assembly processes and also during its subsequent functional operation. For example, the mounting member frequently must withstand the rigors of exposure to those harsh chemicals normally encountered during conventional printed circuit fabrication operations. The finished product must further provide a durable mounting arrangement to permit application of and withstand utilization of conventional final attachment or mounting techniques including the use of mounting screws and other conventional component-mounting devices.

With respect to other physical, thermal and electrical properties which are desirable for use in combination with high power type solid-state devices, it is desirable that the laminate structure as well as individual layers in the laminate possess thermal properties that allow exposure of the assembly to temperature excursions experienced during such processing operations as soldering, brazing and welding. These processes and operations can include exposure to temperatures up to about 400° C., sometimes undertaken in inert or hydrogen atmospheres. Typically, soldering operations may include exposure to temperatures in the area of about 200° C., with certain brazing operations including exposure to temperatures in excess of about 425° C. Materials fabricated from or including copper cannot be expected to possess normal surface characteristics after exposure to temperatures exceeding about 260° C., particularly if such temperature levels are reached while in ordinary atmospheres of air. This limitation on copper is due to the formation of oxides of copper on the surface, with the resultant modification of surface characteristics and, in some instances, loss of strength. A coating or plating of nickel can assist in reducing the formation of oxides of copper, and such coating or plating operations is normally advantageous when dealing with the substance of the present invention.

Exposure to temperatures in the range set forth above are discussed here in order to provide an indication of the variety of conditions to which devices of the present invention may be exposed even though on a short-term basis. While temperature excursions in the area of about 350° C. or higher may be a relatively short duration, such as during certain high temperature soldering operations, the materials utilized must permit the solid-state device and the assembly components to retain their physical and electrical integrity during and after such epposure. Processing temperatures in the area of 350° C. are not unusual, and are typically encountered when conventional 95:5 solder alloys are being utilized. Such solder alloys are frequently employed in the initial soldering operations in certain subassemblies, with later operations employing soldering alloys having somewhat lower melting temperatures. Because of the overall or combined thermal properties of the components comprising the laminates of the present invention, damage to the mounting assembly will not be likely to occur when these normal elevated temperature excursions occur during either processing operations or actual operation of the semiconductor component. Furthermore, because of the demands of production processes, both solvent and chemical resistant properties of the materials are desirable, and the devices of the present invention possess these properties.

Because of their high temperature performance characteristics, polyimide(amide) films have been utilized in combination with semiconductor devices, such as diodes, transistors, integrated circuit devices and the like. In connection with the present invention, filled polyimide(amide) films are utilized in combination with other layers having specific properties in order to provide a highly durable and practical mounting apparatus. For enhanced performance, the polyimide(amide) film in the arrangement of the present invention contains a quantity of a particulate solid, such as from between about 5% and 65% by volume, normally about 20%–50% weight, of a material such as alumina or boron nitride, with the particulate solids having an average particle size along the major dimension ranging from between about 2 microns to 30 microns. These particulate solids are incorporated directly into the polymer matrix, and polyimide(amide) films having such materials incorporated therein are commercially available from E. I. DuPont deNemours Corp. of Wilmington, Del. under the trade name "Kapton M. T." The preparation of the polyimide(amide) base films is described in U.S. Pat. Nos. 2,149,286; 2,407,896; 2,421,024; and 2,502,576. In order to preserve the desirable electrical and physical properties of the polyimide(amide) films, the incorporation of solids is undertaken so as to insure reduction of the quantity of entrained gases such as air in the film. Uniform imperforate films of polyimide(amide) resin are available, with film thicknesses as low as one-quarter mil having been found useful in connection with the assemblies of the present invention. In addition, such films having a thickness of up to about 5 mils are particularly useful, and films of greater cross-sectional thickness may also be utilized.

A further advantage available from the use of polyimide(amide) films loaded with particulate solids is that the high temperature capability of the films make it possible to employ certain metallic treatment techniques which are not normally undertaken when conventional base films are used. Such unusual metal treatment techniques include thermal compression, laser bonding of metals, or flip-and-press bonding operations.

In the past, attempts have been made to utilize thin films in combination with adhesive layers to form a mounting structure. However, such devices have not employed the combination of a polyimide(amide) film loaded with particulate solid, together with a heat spreader layer of the type employed in connection with the present invention. The combination of features available from the components utilized in connection with the present invention provide a finished product with enhanced operational characteristics.

SUMMARY OF THE INVENTION

In accordance with the present invention, one or more thermally conductive electrically insulative layers or members are provided in a thermally conductive-electrically insulative semiconductor device mounting structure with the insulative layers being of relatively thin cross-section and with multiple layers of such insulative materials being arranged in a laminated structure. The electrically insulative members or layers are tough and durable, have good electrical and mechanical properties, and also are filled with particulate solids so as to improve their thermal conductive properties. These layers also possess the capability of withstanding exposure to high temperature excursions of moderate or extended duration. The mounting structures of the present invention include at least three layers or lamina securely bonded toether, with electrically conductive outer layers being disposed on opposite sides of the center electrically insulative layer or layers. Each insulative inner layer is normally a thin imperforate particulate solid loaded polyimide(amide) film, it being possible that other films may be employed and found useful. In certain applications, a film of epoxy resin may be utilized in lieu of the polyimide(amide) film. Such layers will, of course, have significant thickness and will be solid, imperforate, and otherwise compatible with the overall system. In addition to the electrically insulative film layers, one or more metallic layers may be interposed between the insulative layers to function as heat spreader layers. The utilization of multiple thin layers of electrically insulative materials is preferred over the use of a single thick layer. The use of multiple thin layers enhances the electrical performance of the composite system, it having been found that multiple thin electrically insulative layers normally function or perform substantially better than a single layer with a thickness equal to the aggregate thickness of the thin layers. While the utilization of multiple thin layers of film has been found desirable, it is particularly desirable to employ multiple thin layers of the bonding resin to bond the remaining layers together in the assembly.

The polyimide(amide) film layers are filled with a quantity of a thermally conductive electrically insulative particulate solid, preferably a particulate solid selected from the group consisting of aluminum oxide (alumina), boron nitride and mixtures thereof. In addition to such particulate solids, it has been found that other materials may be found useful, including for example, silica, beryllium oxide, aluminum nitride, silicon carbide, zinc oxide, silicon nitride, titanium dioxide, magnesium oxide, aluminum silicate, and diamond. One particularly desirable particulate solid material for either the polyimide(amide) film or the epoxy adhesive layer includes a blend of alumina and boron nitride, with such blends of material having been found to possess anisotropic thermal conductive properties. The outer layers of the assembly include a base metallic plate or substrate of a highly thermally and electrically conductive metal on one surface, such as copper or aluminum. It has been found that steel may be a suitable metal in certain applications. The circuitry layer on the opposed surface is preferably copper, it also having been found that aluminum-clad copper and/or solder-coated copper may be satisfactorily utilized. The copper layer may be cut from sheets of rolled or electro-deposited copper, or alternatively, may be obtained from copper deposited in situ. The combination of physical, mechanical and electrical properties available from the laminate structure provide a highly desirable mounting pad or chassis barrier having good electrical, thermal and mechanical properties, and designed for use in the mounting of solid-state electronic devices onto a heat dissipating chassis or other base pad, particularly when subsequent assembly operations and power dissipation requirements are such that exposure to a high temperature is created over significant periods of time.

In the fabrication of the metallic components used in the structures of the present invention, copper, such as electrolytically formed copper, may be employed. As is recognized in the art, electrolytically refined copper can be mechanically rolled or otherwise treated to reach or achieve its final configuration. In certain instances, electro-refined or electro-deposited copper may be satisfactorily employed. The term "electro-refined" and "electro-deposited" when related to metallic copper is intended to refer to the preparation of a finished product substantially directly from an electrolytic bath without an intervening mechanical treatment such as rolling or the like. Vapor deposited copper or copper layers prepared by sputtering operations may also be used. The flash coating of metallic nickel coating also provides a desirable surface, and reduces the likelihood or tendency to form surface oxides of copper.

In certain applications, the coefficient of thermal expansion of the substrate material may be of interest. In this connection, a base plate may be employed as a replacement or substitute for aluminum and/or copper. Typically, in such applications, a matched coefficient of thermal expansion for the layers may be obtainable through the use of dimensionally stabilized laminates of copper/Invar/copper, or copper/molybdenum/copper. Other suitable base plates may be fabricated from molybdenum and Alloy 42. Such metallic laminates and materials are commercially available.

In other applications, the base plate may be provided as a free-standing base plate, with fins being formed thereon as heat dissipating elements. Also, in certain other applications, additional layers of circuitry may be formed within the system.

OBJECTS

Therefore, it is a primary object of the present invention to provide an improved mounting device for semiconductor devices wherein the mounting device includes a laminate comprising one or more metallic thermally conductive members or layers such as copper arranged on opposed outer surfaces thereof, with one or more centrally disposed thermally conductive electrically insulative members interposed therebetween, with the thermally conductive, electrically insulative members comprising polyimide(amide) films loaded with particulate solids. A metallic layer is preferably interposed between individual separate insulative film layers. The individual layers comprising the laminate are bonded together with an adhesive having appropriate electrical, mechanical, as well as adhesive properties, with epoxy base resin adhesives being the material of choice. The epoxy resin adhesives have particulate solids dispersed therethrough to enhance the thermal conductivity of these layers. The resultant laminate structure is capable of withstanding relatively high temperatures both in later assembly and processing operations, as well as in normal operating conditions. Furthermore, the mounting devices of the present invention are mechanically tough and resistant to deterioration upon exposure to process chemicals, solvents, and adverse ambient conditions.

It is a further object of the present invention to provide an improved disposition of layers in a laminate structure for improving the thermal and electrical properties of a mounting device for retention of semiconductor devices upon a pre-formed circuit array, wherein the device comprises a multi-layered laminate, including one or more inner or center film layers, preferably a polyimide(amide) film filled with a quantity of a thermally conductive electrically insulative particulate solid material selected from the group consisting of aluminum oxide, boron nitride, or mixtures thereof, and with a layer of copper preferably being interposed between discrete layers or multiple discrete layers of the electrically insulative film material.

Other and further objects of the present invention will become apparent to those skilled in the art upon a study of the following specification, appended claims, and accompanying drawing.

IN THE DRAWINGS

FIG. 1 is a perspective view of a typical laminate structure prepared in accordance with the present invention and including a thermally conductive electrically insulative member interposed between a metallic base pad and a circuit array or assembly, with the circuit array or assembly being designed to receive a semiconductor device in operative disposition thereupon;

FIG. 2 is a vertical cross-sectional view taken through a portion of FIG. 1 without the semiconductor device being shown; and FIG. 3 is a vertical sectional view, on an enlarged scale, and illustrating a fragmentary portion of a typical cross-section of an assembly of the present invention such as one taken along the line and in the direction of the arrows 3—3 of FIG. 1, but wherein two separate discrete electrically insulative layers are provided with a layer of copper being interposed therebetween, with each of the individual layers being bonded to its neighbor through an adhesive medium, with the adhesive medium being loaded with particulate solids having specific thermal and electrical properties, and with the entire assembly including the conventional metallic base pad and electrical circuitry arrangement arranged on opposed outer surfaces of the assembly.

DESCRIPTION OF THE PREFERRED EMBODIMENT

In accordance with the preferred embodiment of the present invention, the thermally conductive electrically insulative laminate structure illustrated in FIG. 1 and generally designated 10 is utilized as a semiconductor or solid-state mounting member for attachment to a chassis or heat sink while receiving a semiconductor or solid-state electrical device 11 thereon. Laminate 10 is shown interposed between the undersurface of the semiconductor 11 and a metallic chassis, not shown. Typically, the solid-state device will be a semiconductor electrical current translating device such as a silicon wafer device mounted on the assembly and utilizing conductive leads or lines extending to the appropriate connection zones or points. Normally, semiconductor assemblies are mounted on a metallic or thin ceramic base, and such assemblies are, of course, commercially available. In the structure of FIG. 1, the arrangement is primarily directed to surface mounted semiconductor device assemblies, with the surface mounting capability of the invention providing excellent electrical and thermal properties for the semiconductor assembly. It will be appreciated that the electrical and thermal properties of the device of the present invention also enable it to be used as a mounting surface for semiconductor chip devices or the like wherein the back surface of the chip is bonded directly to the conductors or conductor array. As further illustrated in FIG. 1, in addition to the metallic outer layers 14 and 15, there are two inner non-metallic film layers shown as at 16 and 17. Film layer 16 is a polyimide(amide) film, while layer 17 is a particulate solid laden epoxy film layer. For purposes of illustration of this embodiment, and because of limitations of draftsmanship, the specific individual adhesive layers are not separately illustrated. Such arrangements are illustrated more specifically in FIG. 3 discussed hereinafter. Thus, layer 17, being a particulate solid laden epoxy film, is formed either in situ, or cast as a separate layer in an individual film-forming casting operation.

The thermally conductive electrically insulative laminate structure 10 includes a pair of metallic outer layers 14 and 15, separated by multiple center insulative layers 16 and 17. In the o embodiment of FIG. 3, intermediate metallic layer 18 functions as a heat spreader. With continued reference to FIG. 1, outer layer 14 is a metallic base pad, and with outer layer 15 being in the form of printed circuitry to provide appropriate leads for the solid-state electrical device to be mounted thereon.

In the embodiment shown in FIG. 3, like reference numerals are employed to designate similar components utilized from the embodiment of FIG. 1. As has been indicated, layer 18 is a heat spreader layer, with both layers 16 and 19 being polyimide(amide) layers laden with thermally conductive, electrically insulative particulate solids. Layers 17-17 are epoxy resin adhesive layers utilized to bond the individual layers together to form a unit, with each of the epoxy adhesive layers being laden with thermally conductive, electrically insulative particulate solids. The mounting between the solid-state electrical device 11 and circuitry 15 is such that appropriate heat transfer occurs through thermal conductivity. In order to provide enhanced thermal conductivity both through and across the circuitry layers, it has been found that heat transfer is improved when the thickness of the circuitry layer exceeds approximately seven mils. Metallic members 14 and 18 are preferably fabricated of either copper or aluminum. However in arrangements having less demanding thermal dissipation requires, it has been found that steel may function as a material for layer 14 as well with somewhat less cross-sectional thicknesses being possible with steel, such as about 35 mils. Circuitry layer 15 is preferably fabricated of copper or aluminum-clad copper, it also having been found that copper with a solder coating may be useful. Conventional forming techniques for preparing the appropriate circuit configurations are, of course, well known in the art.

In order to appropriately couple, form and/or bond the individual members of the laminate together, thermally conductive electrically insulative member 16 is firmly bonded between layers 14 and 19. Again, materials and techniques for bonding are well known in the art. Thin layers of epoxy base resins filled with the materials listed hereinabove are, of course, useful in the bonding operations. Either single or multiple layers of epoxy resins may be employed, it having been found that epoxy resins of either the phenolic-based or aromatic-based epoxies such as Novolac or bisphenol-A types may be employed. It is, of course, necessary to prepare the bonding layer without entrapment of air, since air entrapment inhibits heat transfer by thermal conductivity as well as contribute to a deterioration of the electrical properties otherwise available in the system. Materials used for bonding may contain fillers selected for their enhancement of thermal conductivity such as aluminum oxide, boron nitride or the like.

In order to accomplish the actual bonding operation, adhesives formulated from epoxy as indicated above are preferred, although silicone resins, as well as polyimides may be suitably employed. These adhesive systems will normally withstand intermittent exposure to normal processing operations at temperatures up to about 400° C., this being possible in the arrangement of the present invention even though the individual adhesive systems typically offer an operational limit of between about 150°-220° C. Intermittent exposure to these elevated processing temperatures is possible by virtue of the overall thermal capability of the arrangement of the present invention.

In order to render the films 16 and 17 thermally conductive, a quantity of a particulate solid such as aluminum oxide, boron nitride or mixtures thereof is distributed through the polymer matrix. For most purposes, the quantity of particulate solid ranges from between about 2% and 65% by volume of particulate material to resin film solids, with the particulate solids having an average particle size in the major dimension ranging from between about 2 microns and 100 microns. With respect to particle size dimension, it will be appreciated that individual particles may be of irregular shape or configuration, and that there may be different methods used for measuring the particle size. In this connection, however, particle size dimension is defined in its conventional form. Also, the particle size is defined as the average particle size, it being appreciated that certain particles will be somewhat larger, and others somewhat smaller than the "average" size dimension given. Furthermore, the features of the present invention may be optimized by selection of an appropriate size distribution of particles, with the optimum size distribution being based at least in part upon achieving a desired packing density for the solid particles. Packing density will contribute to enhanced thermal conductivity. In this connection, therefore, the utilization of such a particulate solid enhances thermal transfer, without adversely affecting the electrical properties. Average particle sizes ranging from between 2 microns and 10 microns are preferred.

In certain applications, mixtures of alumina and boron nitride may be employed advantageously. Certain ratios of these two components may be mutually advantageous, with synergistic effects being observed, particularly with respect to the thermal transfer properties. While the appropriate materials may be utilized, certain fibers may be advantageously employed as well. With respect to particle size ranges, most frequently particle sizes less than the thickness of the film will typically be selected, however for certain applications, particle sizes which exceed the nominal film thickness have been found useful.

Layers 16 and 17 are normally adhesive film layers, and will have a thickness of about 1 mil, it being appreciated that other film thicknesses may be employed. An adhesive layer of epoxy material having a thickness of 1 mil has been found to provide a volume resistivity of approximately $10^{14}$ ohm centimeters, with a dielectric strength capable of withstanding about 1000 volts per mil. In certain applications, the adhesive film may be pre-coated on the surface of the polyimide(amide) material, and when pre-coated, the pre-coating operation may provide for a greater degree of uniformity of thickness, along with an appropriate reduction in the presence of entrapped gases such as air.

The polyimide(amide) films with particulate solids contained therein are available commercially. Such films have good physical properties and are known for their high temperature capabilities. In the present laminate structure, and particularly while the semiconductor device is under operational conditions, temperatures in the range of about 180° C. may be tolerated over extended periods of time without adversely affecting the properties and/or qualities of the laminate structure. In the structures prepared in accordance with the present invention, films containing particulate solids possess significantly improved thermal conductivity properties when compared with similar films free of such solids. The conductive layers of the present assembly permit higher electrical stress levels on the semiconductor translating device 11, with these higher levels being made possible because of the enhanced thermal conductivity of the system leading to a corresponding reduction and/or leveling in semiconductor device operating temperature.

While the metallic films employed in connection with the apparatus of the present invention are normally formed separately and in sheet form, other forms of metal may also be employed. For example, certain structures may be advantageously prepared by electroplating or otherwise placing the circuit directly onto the surface of the polyimide(amide) film. In such situations, the particulate loaded polyimide(amide) film is ideally situated and disposed for conducting heat from the circuit thus formed.

By way of specific examples, the following devices may be prepared:

EXAMPLE I

A one-ounce layer of copper having a flash coating of nickel thereon is employed as the outer metallic layer. Two layers of one mil epoxy blended with 25% by volume of alumina having an average particle size of about 5 microns are provided. These epoxy layers are then bonded to a layer of thick aluminum, such as aluminum having a thickness of about 0.062 inch or greater. The epoxy resin consists of epoxy derived from bisphenol-A. These structures may be employed when dielectric strengths are not required to exceed about 2000 volts between the outer layers.

EXAMPLE II

In accordance with one embodiment of the present invention and for high voltage, high power output applications, a layer of polyimide(amide) is added between the epoxy layers, with a dielectric strength exceeding 7000 volts being obtained when the polyimide(amide) layer exceeds about 1 mil in thickness and contains approximately 30% by weight of alumina based upon resin solids and having an average particle size of 5 microns. The epoxy resin material contains a Novolac epoxy.

EXAMPLE III

When excessive heat is expected to be generated by the fabrication of the semiconductor device, flash nickel coated copper foil is employed, with the copper being two-ounce copper. A layer of alumina loaded polyimide(amide) film as in Example II is interposed beneath the copper foil with a layer of 7 mil copper being provided beneath the polyimide(amide) film. Dual films of epoxy resin filled with 40% by volume of a mixture of alumina-boron nitride of average particle size of 5 microns are used to bond the individual layers together. The base layer is aluminum having a thickness of 0.062 inch, with greater base layer thicknesses being equally useful.

EXAMPLE IV

The device of Example III is provided with an outer layer of nickel flash treated aluminum-clad copper foil. This arrangement is particularly desirable when employing wire-bonding interconnections on the circuit layer.

EXAMPLE V

The device of Example III is provided, with the exception of a substitute of the base mounting member. Specifically, a multiple layer, dimensionally stable member is provided of copper/Invar/copper having a thickness of 0.060 inch, and with the individual copper layers each having a thickness of 0.012 inch.

GENERAL DISCUSSION: EXAMPLES I-V

The operation of semiconductor devices normally involves varying degrees of intensity. Intensity of utilization may be equated to absolute temperatures achieved during operation. The magnitude of the actual absolute temperatures reached are, of course, reflected by the exposure of the semiconductor device to combinations of power levels during finite periods of time. As can be appreciated, the actual absolute temperatures reached are directly proportional to the power dissipation and time factors. Because of the arrangement of the various layers in the mounting devices of the present invention, expeditious heat transfer is achieved, thereby permitting an increase in the intensity of utilization of semiconductor devices. One of the significant advantages of the surface mounting material of the present invention is in the improved design of printed circuit arrangements, particularly those supporting active components. In the present materials, it is possible to achieve greater thermal dissipation than has otherwise been available, thus utilization of active components where a greater rate of thermal dissipation is required may be achieved. A further advantage is that material of the present invention is not subject to burn or otherwise thermally decompose under those conditions where conventional material may undergo such decomposition.

As has been indicated, the semiconductor device, such as semiconductor assembly 11 is secured to the surface of the mounting device as illustrated in FIG. 1. Depending upon its ultimate application, the entire assembly may be employed without requiring attachment to any external chassis or heat sink, however such attachment may be desirable in certain applications. In those situations where exposure of the semiconductor device to certain elevated temperatures occurs on a reasonably continuous basis, and when these elevated temperatures are in excess of those temperatures that would ordinarily interrupt the operation or terminate the stability of operation for the semiconductor device; then mounting upon a suitable heat dissipating chassis or heat sink is required for reliability. Conventional mounting techniques for semiconductor devices may be utilized with the mounting devices of the present invention, such as attachment by appropriate means such as by nuts and screws or other known means.

The thermal, electrical and other properties of a typical product prepared in accordance with the present invention are set forth in Table I hereinbelow:

TABLE I

| PROPERTY | TYPICAL VALUE | TEST METHOD |
|---|---|---|
| Thickness: | | |
| (a) base layer 14 | 0.015" to 0.125" | |
| (b) Thermally conductive-electrically insulative film such as polyimide(amide) layer and bonding adhesives: 0.001" to .004" total thickness | | |
| (c) mounting layer, copper | about .0005" to about .025" | |
| Continuous Use Temp. | −60° to +200° C.* | |
| Volume Resistivity | $10^{14}$ ohm-cm. (typical) | ASTM D 257 |
| Dielectric breakdown | 2000 to 6000 volts total (¼" electrode) | ASTM D 149 |
| Thermal conductance of insulating layer | 0.3 watts meter $^{-1}$/°K. | |

*must be consistent with upper limit of the semiconductor device.

In Table I, the thermal conductance is given as that observed for an alumina filled polyimide(amide) film containing about 30% of alumina, having an average size of approximately 5 microns, balance polyimide(amide) solids and bonded together with epoxy adhesive layers. In addition, the bonding adhesive layer is typically epoxy resin. By way of further explanation, this system may be expressed in terms of its thermal resistance, specifically °C./Watt/square inch.

To illustrate the advantages of this system, the following data are provided for a conventional D-pak semiconductor package dissipating from 0.5 to 5 watts:

EXAMPLE VI

| | THERMAL RESISTANCE °c./w | | |
|---|---|---|---|
| Power (Watts) | Aluminum Base Substrate | Copper Base Substrate | Conventional G10 Circuit Material |
| 1.0 | .85 | 1.1 | 8.2 |
| 2.0 | .92 | .8 | burns |
| 3.0 | .92 | .7 | burns |
| 5.0 | 1.1 | 1.0 | burns |

When boron nitride is employed as the particulate filler for the film and adhesive layers, the thermal conductivity value is modestly increased, it being understood that the thermal conductivity for boron nitride filled materials may be improved by certain processing techniques to take advantage of its higher thermal conductivity and the anisotropic thermal behavior of the material.

In addition to alumina and boron nitride, other thermally conductive electrically insulative particulate solids possessing good electrical properties and high temperature capability may be utilized including, for example, silica, beryllium oxide, aluminum nitride, silicon arbide, zinc oxide and silicon nitride. The ratio to resin solids is generally the same for these solids.

In addition, and subject to the specific applications of the devices mounted on the assembly, it may be desirable in certain instances to utilize layers which are capable of flowing under modest pressure so as to provide an increase in the actual area of surface contact between the layers so as to reduce or eliminate entrapped air, thus maximizing heat transfer to the chassis.

A significant advantage of the apparatus of the present invention resides in control of thermal runaway in semiconductor devices. As is recognized, the rate of heat generation in semiconductor devices increases as the absolute temperature of the device increases. Accordingly, when considering the constraints of miniaturization and the smaller areas involved, it becomes extremely important to enhance the heat transfer capabilities in order to avoid creation of runaway situations. The mounting apparatus of the present invention creates a greater degree of flexibility for the circuit designer and applications engineer.

It will be appreciated that various modifications may be employed in connection with the fabrication of laminates such as defined herein without departing from the scope of the present invention.

What is claimed is:

1. Base means for mounting semiconductor devices onto a heat dissipating thermally conductive support and comprising:
   (a) a base substrate means comprising a sheet of at least one layer of a thermally conductive metal selected from the group consisting of copper, aluminum, steel, Alloy 42, Invar, Kovar and molybdenum and laminates thereof, and with said base substrate having a cross-sectional thickness in excess of about 15 mils;
   (b) an imperforate polyimide(amide) film bonded with a first layer of adhesive to the upper surface of said base substrate, said film and said adhesive layer each containing a thermally conductive electrically insulative particulate solid therein selected from the group consisting of aluminum oxide, boron nitride, silic, beryllium oxide, magnesium oxide, titanium dioxide, aluminum nitride, silicon carbide, zinc oxide, diamond and silicon nitride in an amount from between 20% and 200% by weight of polyimide(amide) solids and adhesive solids respectively, and with the polyimide(amide) film having a thickness of between about one-quarter mil and 5 mils; and
   (c) electrically conductive circuitry secured to the upper surface of said polyimide(amide) film with a second layer of adhesive, said first and second adhesive layers having a thickness in excess of about one-quarter mil and having means arranged along the outer surface of said electrically conductive circuitry and along the exposed surface of said second layer of adhesive to mountingly receive and support the underside surface of a semiconductor device in heat dissipating relationship with said thermally conductive support.

2. The base means as defined in claim 1 being particularly characterized in that said electrically conductive circuitry is adhesively bonded to the upper surface of said polyimide(amide) film, and with said adhesive layer being selected from the group consisting of acrylic resin adhesives and epoxy resin adhesives.

3. The base means as defined in claim 1 being particularly characterized in that said electrically conductive circuitry is adhesively bonded to the upper surface of said polyimide(amide) film, and with said adhesive layer being an epoxy resin adhesive and having a thickness of between about one-half mil and two mils.

4. The base means as defined in claim 1 being particularly characterized in that said electrically conductive circuitry comprises a sheet of copper having a flash coating of nickel thereon, and wherein said layer of adhesive is bonded to the nickel surface of said base substrate.

5. The base means as defined in claim 1 being particularly characterized in that said base substrate comprises a multi-layer laminate including a center layer of an iron-nickel alloy containing between 40% and 50% by weight of nickel, balance iron, with a metal dissimilar to the said center layer disposed on opposite surfaces of said center layer.

6. The base means as defined in claim 1 being particularly characterized in that said base substrate comprises a multi-layer laminate wherein at least one of said layers comprises a sintered mixture of iron and nickel containing between about 40% and 50% by weight of nickel, balance iron.

7. The base means as defined in claim 1 being particularly characterized in that said base substrate comprises a multi-layer laminate including a center layer of molybdenum, with a metal dissimilar to molybdenum disposed on opposite surfaces of said center layer.

8. The base means as defined in claim 1 being particularly characterized in that said base substrate comprises a layer of molybdenum.

9. The base means as defined in claim 1 being particularly characterized in that said base substrate comprises a layer of Invar.

10. The base means as defined in claim 1 being particularly characterized in that said base substrate and said electrically conductive circuitry comprise electrodeposited copper having a flash coating of nickel thereon, and wherein a polymeric layer is bonded to the nickel surface of each of said base substrate and said electrically conductive circuitry.

11. The base means as defined in claim 1 being particularly characterized in that said electrically conductive circuitry comprises aluminum-clad copper.

12. The base means as defined in claim 1 being particularly characterized in that said electrically conductive circuitry comprises copper having a film of solder on the outer surface thereof.

13. The base means as defined in claim 1 being particularly characterized in that said base substrate comprises rolled copper.

14. The base means as defined in claim 1 being particularly characterized in that said base substrate comprises a multi-layer laminate, and wherein said laminate comprises at least one layer of rolled copper.

15. The base means as defined in claim 1 being particularly characterized in that said base substrate comprises a layer of electro-deposited copper having a thickness greater than one mil with a nickel flash coating on the outer surface thereof.

16. The base means as defined in claim 1 being particularly characterized in that each of said first and second adhesive layers consist of at least two discrete imperforate film layers of epoxy base resin.

17. Base means for mounting semiconductor devices onto a heat dissipating thermally conductive support and comprising:
(a) a base substrate means comprising a sheet of at least one layer of a thermally conductive metal selected from the group consisting of copper, aluminum, steel, Alloy 42, Invar, Kovar and molybdenum and laminates thereof, and with said base substrate having a cross-sectional thickness in excess of about 15 mils and arranged along one surface of said base means;
(b) electrically conductive circuitry arranged in oppositely disposed relationship to said base substrate means and having a thickness in excess of about one-quarter mil and having means arranged on the outer surface thereof to mountingly receive and support a semiconductor device in heat dissipating relationship thereon;
(c) heat spreader means comprising a highly thermally conductive metallic layer selected from the group consisting of aluminum and copper and being interposed between said base substrate and said electrically conductive circuitry;
(d) a pair of imperforate polyimide(amide) films, one interposed between said heat spreader means and said base substrate means and one interposed between said heat spreader means and said electrically conductive circuitry;
(e) a substantially continuous void-free adhesive film bonding adjacent members of said base means together, one to another, each of said imperforate polyimide(amide) films and said adhesive layers each containing a thermally conductive electrically insulative particulate solid therein selected from the group consisting of aluminum oxide, boron nitride, silica, beryllium oxide, magnesium oxide, titanium dioxide, aluminum nitride, silicon carbide, zinc oxide, and silicon nitride in an amount from between 20% and 200% by weight of polyimide(amide) solids and adhesive solids respectively, and with the polyimide(amide) film having a thickness in excess of about one-quarter mil.

18. The base means as defined in claim 17 being particularly characterized in that said adhesive films comprise an epoxy resin selected from the group consisting of phenolic and bisphenol-A epoxies.

19. The base means as defined in claim 17 being particularly characterized in that said thermally conductive, electrically insulative particulate solid is selected from the group consisting of aluminum oxide, aluminum nitride, boron nitride and mixtures thereof.

20. The base means as defined in claim 17 being particularly characterized in that each of said adhesive films has a cross-sectional thickness of greater than one-half mil.

21. The base means as defined in claim 17 being particularly characterized in that said base substrate means comprises a sheet of copper having a flash coating of nickel thereon, and wherein said layer of adhesive is bonded to the nickel surface of said base substrate.

22. The base means as defined in claim 17 being particularly characterized in that said base substrate comprises a multi-layer laminate including a center layer of an iron-nickel alloy containing between 40% and 50% by weight of nickel, balance iron, with a metal dissimilar to the said center layer disposed on opposite surfaces of said center layer.

23. The base means as defined in claim 17 being particularly characterized in that said base substrate comprises a multi-layer laminate wherein at least one of said layers comprises a sintered mixture of iron and nickel containing between about 40% and 50% by weight of nickel, balance iron.

24. The base means as defined in claim 17 being particularly characterized in that said base substrate comprises a multi-layer laminate including a center layer of molybdenum, with a metal dissimilar to molybdenum disposed on opposite surfaces of said center layer.

25. The base means as defined in claim 17 being particularly characterized in that said base substrate comprises a layer of molybdenum.

26. The base means as defined in claim 17 being particularly characterized in that said base substrate comprises a layer of Invar.

27. Base means for mounting semiconductor devices onto a heat dissipating thermally conductive support and comprising:
(a) a base substrate means comprising a sheet of at least one layer of a thermally conductive metal selected from the group consisting of copper, aluminum, steel, Alloy 42, Invar, Kovar and molybdenum and laminates thereof, and with said base substrate having a cross-sectional thickness in excess of about 15 mils and arranged along one surface of said base means;
(b) electrically conductive circuitry arranged in oppositely disposed relationship to said base substrate means and having a thickness in excess of about one-quarter mil and having means arranged on the outer surface thereof to mountingly receive and support a semiconductor device in heat dissipating relationship thereon;
(c) means comprising highly thermally conductive layers interposed between said substrate and said electrically conductive circuitry, said means comprising at least two imperforate layers interposed therebetween;

(d) a substantially continuous void-free epoxy resin adhesive film bonding adjacent members of said base means together, one to another, each of said imperforate films and said adhesive layers each containing a thermally conductive electrically insulative particulate solid therein selected from the group consisting of aluminum oxide, boron nitride, silica, beryllium oxide, magnesium oxide, titanium dioxide, aluminum nitride, silicon carbide, zinc oxide, and silicon nitride in an amount from between 20% and 200% by weight of imperforate solids and adhesive solids respectively, and with the imperforate film consisting essentially of an epoxy resin and having a thickness in excess of about one-quarter mil.

28. Base means for mounting semiconductor devices onto a heat dissipating thermally conductive support and comprising:

(a) a base substrate means comprising a sheet of at least one layer of a thermally conductive metal slelected from the group consisting of copper, aluminum, steel, Alloy 42, Invar Kovar and molybdenum and laminates thereof, and with said base substrate having a cross-sectional thickness in excess of about 15 mils and arranged along one surface of said base means;

(b) electrically conductive circuitry arranged in oppositely disposed relationship to said base substrate means and having a thickness in excess of about one-quarter mil and having means arranged along and adjacent the outer surface of said circuitry to mountingly receive and support the undersurface of a semiconductor device in heat dissipating relationship thereon;

(c) heat spreader means comprising a highly thermally conductive metallic layer selected from the group consisting of aluminum and copper and being interposed between said substrate and said electrically conductive circuitry;

(d) a pair of imperforate films, one interposed between said heat spreader means and said base substrate means and one interposed between said heat spreader means and said electrically conductive circuitry;

(e) a substantially continuous void-free epoxy resin adhesive film bonding adjacent members of said base means together, one to another, each of said imperforate films and said adhesive layers each containing a thermally conductive electrically insulative particulate solid therein selected from the group consisting of aluminum oxide, boron nitride, silica, beryllium oxide, magnesium oxide, titanium dioxide, aluminum nitride, silicon carbide, zinc oxide, and silicon nitride in an amount from between 20% and ®% by weight of imperforate solids and adhesive solids respectively, and with the imperforate film having a thickness in excess of about one-quarter mil.

29. The base means as defined in claim 28 being particularly characterized in that said electrically conductive circuitry is adhesively bonded to the upper surface of said imperforate film disposed between said heat spreader means and said electrically conductive circuitry and with said epoxy adhesive layer having a thickness less than about two mils.

30. The base means as defined in claim 28 being particularly characterized in that said adhesive films comprise an epoxy resin selected from the group consisting of phenolic and bisphenol-A epoxies.

31. The base means as defined in claim 28 being particularly characterized in that said electrically conductive circuitry comprises aluminum-clad copper with a nickel flash coating thereon.

32. The base means as defined in claim 28 being particularly characterized in that said electrically conductive circuitry comprises copper having a thickness of at least seven mils.

33. The base means as defined in claim 28 being particularly characterized in that said base substrate comprises electro-deposited copper having a nickel flash coating on the outer surface thereof.

34. The base means as defined in claim 28 being particularly characterized in that each adhesive film bonding adjacent members of said base means together comprises a pair of independent discrete adhesive film layers bonded together to form said substantially continuous void-free adhesive film.

* * * * *

UNITED STATES PATENT AND TRADEMARK OFFICE
CERTIFICATE OF CORRECTION

PATENT NO. :   4,810,563
DATED      :   March 7, 1989
INVENTOR(S) :  David C. DeGree, et al It is certified that error appears in the above-identified patent and that said Letters Patent is hereby corrected as shown below:

Column 14, line 7, "silic" should read -- silica --.

Column 17, line 24, "slelected" should read -- selected --.

Column 18, line 13, " ®  %" should read -- 200% --.

Signed and Sealed this

Fifteenth Day of August, 1989

Attest:

DONALD J. QUIGG

*Attesting Officer*   Commissioner of Patents and Trademarks